United States Patent [19]

Jones

[11] 4,137,511
[45] Jan. 30, 1979

[54] ELECTROMECHANICAL FILTER AND RESONATOR

[75] Inventor: Joseph S. Jones, Macungie, Pa.

[73] Assignee: Bell Telephone Laboratories, Incorporated, Murray Hill, N.J.

[21] Appl. No.: 832,932

[22] Filed: Sep. 13, 1977

[51] Int. Cl.² ............... H03H 9/04; H03H 9/24; H03H 9/26

[52] U.S. Cl. .................................. 333/71; 333/72

[58] Field of Search ............... 333/71, 72; 331/116 M, 331/156, 154; 310/329–332, 311

[56] References Cited

U.S. PATENT DOCUMENTS

| | | | |
|---|---|---|---|
| 3,064,213 | 11/1962 | Mason | 333/72 X |
| 3,264,585 | 8/1966 | Poschenrieder | 333/72 |
| 3,490,056 | 1/1970 | Warren et al. | 333/72 |
| 3,638,145 | 1/1972 | Papadakis | 333/71 |

OTHER PUBLICATIONS

Mason et al.–"A compact Electromechanical band-pass filter for frequencies below 20 kilicycles" in IRE Trans. on Ultrasonic Engineering, Jun. 1960; pp. 59–70.
Papadakis–"Improvements in a broadband electromechanical filter in the voice band" in IEEE Trans. on sonics and ultrasonics, vol. SU22, No. 6, Nov. 1975; pp. 406–415.

Primary Examiner—Alfred E. Smith
Assistant Examiner—Marvin Nussbaum
Attorney, Agent, or Firm—Maurice M. de Picciotto; Lucian C. Canepa

[57] ABSTRACT

An electromechanical resonator, in the form of a single planar body, comprises a flexurally vibrating resonating element coupled at its midplane to a pair of torsionally vibrating couplers. Unwanted flexural modes in the resonator are substantially reduced by selecting a length-to-width ratio of the resonating element ranging between 3 and 4. A bandpass filter comprising a plurality of such electromechanical resonators may operate essentially free of spurious responses over a band of at least 200 kHz.

8 Claims, 3 Drawing Figures

ELECTROMECHANICAL FILTER AND RESONATOR

The present invention relates to oscillatory wave energy transmission systems, and more particularly to electromechanical filters and resonators.

BACKGROUND OF THE INVENTION

Electromechanical filters and resonators usually comprise one or more transducers for converting oscillatory wave energy from electrical to mechanical form and vice versa in combination with a mechanical resonating element coupled to the transducer or transducers. One such filter is described in U.S. Pat. No. 3,064,213 issued to W. P. Mason on Nov. 13, 1962 and assigned to the assignee hereof, and another such filter is, for example, described in U.S. Pat. No. 3,264,585 issued to W. Poschenrieder on Aug. 2, 1966. The former of these two known electromechanical filters comprises a series of elongated bars connected to a central strip at or near their midpoints. The bars vibrate in the flexural mode about the central strip. It has now been found that this known filter is subject to unwanted longitudinal vibrations along the central strip affecting its response and stability. The latter of these two known electromechanical filters comprises an input and an output resonator vibrating in the longitudinal mode by means of electrostrictive transducer elements attached to both sides thereof. Similar unwanted modes were found affecting the stability and operation of such a known filter.

One attempt at solving the foregoing problem is described in U.S. Pat. No. 3,638,145 issued to E. P. Papadakis on Jan. 25, 1972 and assigned to the assignee hereof. In such a known arrangement, unwanted longitudinal resonances are eliminated by using a reinforcing member along the central strip of the electromechanical filter. Although such a method is acceptable for certain applications, it is primarily concerned with unwanted longitudinal bending modes interfering with the efficient operation of the filter. Moreover, such a known solution cannot be used when a light and compact filter or resonator free of unwanted flexural modes is needed.

SUMMARY OF THE INVENTION

The above problems are solved in an illustrative embodiment of the present invention wherein an electromechanical filter or resonator in the form of a single planar body comprises an elongated torsionally vibrating member, and a flexurally vibrating resonating element coupled along its nodal axis to the member. A pair of electromechanical transducers is attached to at least one side of the resonating element for exciting and/or detecting mechanical vibrations in the filter or resonator. Mounting sections located at both ends of the member are used to attach the filter or resonator to a base. In accordance with the present invention, the flexurally vibrating resonating element has a length, L, along a direction transverse to the torsionally vibrating member elongated direction, and a width, b, along the elongated direction such that the ratio L/b ranges between 3 and 4, thereby substantially reducing unwanted flexural modes in the filter or resonator.

In accordance with an illustrative embodiment of the present invention, an electromechanical filter in the form of a single planar body comprises an elongated torsionally vibrating central member, and first and second flexurally vibrating resonators located along the central member at or about their respective nodal axes, each resonator extending transversely away from the central member in opposite directions in a single plane. Electromechanical input and output transducers are respectively attached to at least one side of the first and second resonator for respectively exciting and detecting mechanical vibrations in the filter. The filter further comprises mounting sections located at both ends of the central member for attaching the filter to a base. In accordance with the present invention, each resonator has a length, L, along a direction transverse to the central member elongated direction, and a width, b, along the central member elongated direction such that the ratio L/b ranges between 3 and 4, thereby substantially reducing unwanted flexural modes in the filter. In a preferred embodiment of the present invention, the L/b ratio is of the order of 3.8.

In accordance with a further embodiment of the invention, the electromechanical filter comprises a plurality of flexurally vibrating resonators spaced along the central member at substantially equidistant positions. The resonators are dimensioned such that their respective length-to-width ratios, L/b, range between 3 and 4.

One object of the present invention is to substantially reduce unwanted out-of-band responses in an electromechanical filter and resonator.

Another object of the present invention is to achieve an electromechanical filter and resonator having a stability and precision comparable to that of a quartz filter.

A further object of the present invention is to realize a simple and economical metal reed electromechanical filter and resonator essentially free of spurious responses over a band of at least 200 kHz.

A still further object of the present invention is to realize a compact mechanical bandpass filter of the type applicable to analog channel banks.

These and other objects and advantages of this invention will appear more fully upon consideration of the various illustrative embodiments now to be described in detail in connection with the accompanying drawings.

DETAILED DESCRIPTION

Figure 1:
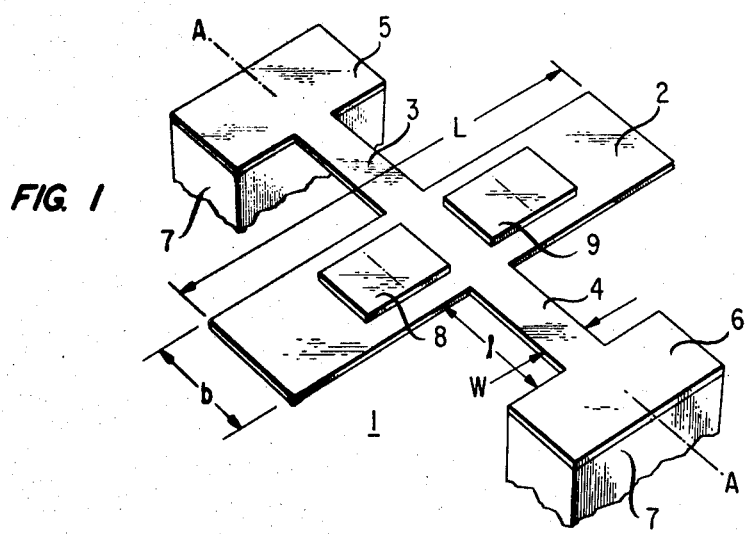
FIG. 1 shows a perspective view of an electromechanical resonator in accordance with the present invention.

Referring now to an illustrative embodiment of the invention, as shown in FIG. 1, an electromechanical resonator in the form of a single planar body 1 comprises a resonating element 2 coupled to a pair of torsionally vibrating members 3 and 4. Members 3 and 4 are coupled to resonating element 2 along its nodal axis. A pair of mounting sections 5 and 6 are respectively attached to members 3 and 4 to enable mounting of the resonator 1 on a base 7. In order to excite mechanical vibration in the resonating element 2, a pair of electromechanical transducers 8 and 9 are attached to one side of element 2. The planar body 1 comprising element 2, members 3 and 4 and sections 5 and 6, is stamped or machined from a single thin sheet of resilient material, e.g. steel, iron-nickel alloy, or quartz. The transducers 8 and 9 are preferably small piezoelectric ceramic transducers attached to one face of element 2 according to known techniques. The piezoelectric transducers 8 and 9 drive the resonating element in a flexural anti-symmetric mode and the members 3 and 4 vibrate in the torsional mode. However, if the resonating element 2 is made of quartz, piezoelectric transducers 8 and 9 are not needed. Instead, metal electrodes may be deposited on both sides of the quartz element 2 in accordance with known techniques.

In accordance with the present invention, the applicant has discovered that a variation of the "aspect ratio" of the resonating element 2 results in a substantial suppression of unwanted modes or responses of the resonator 1. The aspect ratio is defined as the ratio of the length L over the width b of element 2. These unwanted modes and responses were identified as a complex flexural mode. In accordance with an embodiment of the invention, an aspect ratio ranging between 3 and 4 was found to substantially eliminate the unwanted responses.

In an illustrative embodiment of a 106 kHz resonator according to the present invention, the planar body is made of an iron-nickel alloy having a thickness of 0.020 inches, and the transducers 8 and 9 are made of PZT material having dimensions of 0.056 × 0.071 × 0.006 inches. In such an embodiment, resonating element 2 has a length L of 0.312 inches and a width b of 0.084 inches resulting in an aspect ratio of 3.7. The torsionally vibrating members 3 and 4 have a length l of 0.092 inches and a width w of 0.030. Piezoelectric transducers 8 and 9 are bonded to the resonating element 2 such that their mid axes are displaced with respect to the resonator axis A-A by approximately 0.056 inches. However, for frequencies other than 106 kHz, the dimensions of the resonator would differ while maintaining the same aspect ratio.

Figure 2:
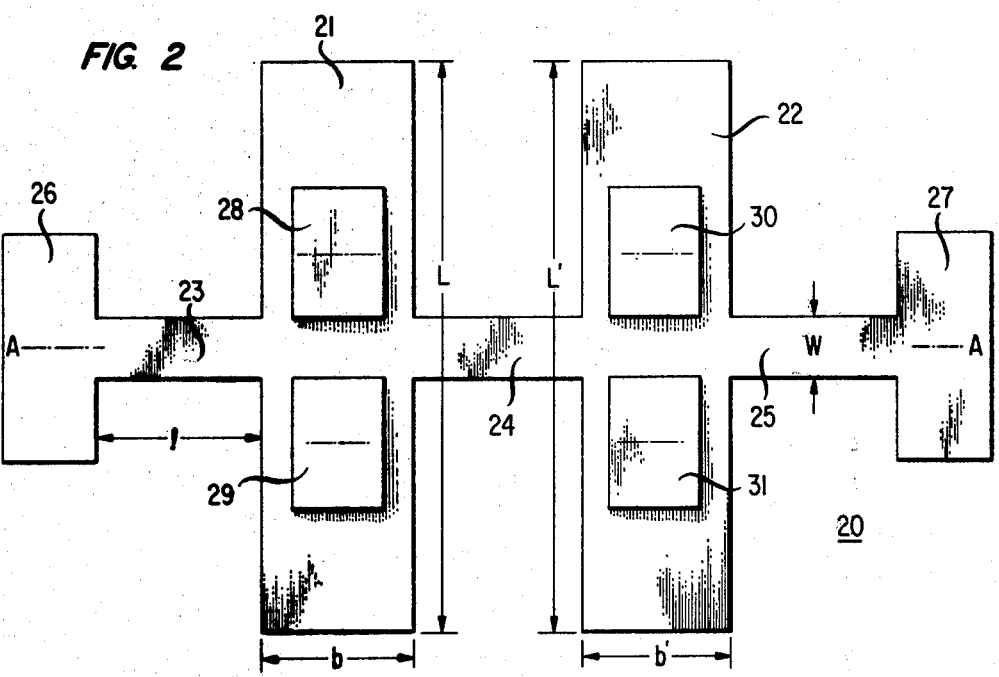
FIG. 2 is a top view of an electromechanical filter in accordance with one embodiment of the present invention.

An electromechanical metal reed filter suitable as a bandpass filter is shown in FIG. 2. This new bandpass filter is in the form of a single metal planar body 20 comprising a pair of resonating elements 21 and 22 coupled at their respective nodal axes to torsional vibrating members 23, 24 and 25. A pair of mounting sections 26 and 27 are respectively attached to members 23 and 25 for mounting the metal filter to a base (not shown). A first pair of ceramic transducers 28 and 29 is attached to at least one face of resonating element 21 for exciting flexural vibrations therein in response to an electrical input signal. A second pair of ceramic transducers 30 and 31 is attached to at least one face of resonating element 22 for detecting the vibration of the filter and converting it into an electrical output signal. In this illustrative embodiment, the planar metallic body 20 may consist of a thin sheet of steel or of iron-nickel either stamped or machined to achieve the shape shown in FIG. 2. Machining of the body may be either through mechanical means, chemical means, or electro-discharge machining also known as electro-erosion.

In accordance with the principles of the present invention, unwanted responses are identified as complex flexural modes, the frequencies of which are governed by the aspect ratio of resonating elements 21 and 22. In order to reduce the unwanted modes or responses in such a bandpass filter, the aspect ratio of elements 21 and 22 is chosen between 3 and 4. Although it is advantageous to keep the aspect ratio constant throughout the filter, it is not necessary that the length L of resonating element 21 be equal to the length L' of resonating element 22. However, what is required in order to reduce the unwanted modes is that:

$$3 \leq L/b \leq 4$$

and $$3 \leq L'/b' \leq 4$$

In an advantageous embodiment of the present invention, an electromechanical filter comprises a plurality of resonators arranged such that a first group of resonators has a first aspect ratio, and a second group of resonators exhibits a second aspect ratio. The first and second aspect ratios range between 3 and 4 in order to substantially eliminate unwanted flexural modes in the filter. Aspect ratios of 3.8 and 3.3 for the first and second group of resonators, respectively, were found to achieve a filter essentially free of spurious responses.

Figure 3:
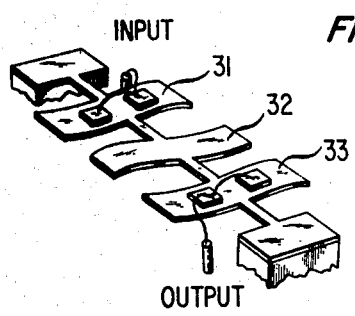
FIG. 3 shows a perspective view of an electromechanical filter in accordance with the present invention.

Referring now to FIG. 3, an electromechanical metal reed bandpass filter is shown comprising three flexurally vibrating elements 31, 32 and 33. In the drawing, the flexural motion of elements 31, 32 and 33 is exaggerated for clarity only. This metal-reed filter (MRF) can be designed to operate at frequencies from about 0.1 kHz to 1 MHz and with bandwidths up to about 25 percent of the center frequency. In a channel bank application, an eight-resonator filter in accordance with the present invention exhibits less than 0.7 db peak-to-peak ripple in a 3.5 kHz wide passband around 100 kHz with an attenuation rising to 45 db in an 800 Hz transition band. A 250 Hz-wide filter at 50 kHz having a Gaussian passband can be realized with a three-resonator filter of the type shown in FIG. 3. The attenuation in such case rises to 50 db in a 1.25 kHz transition band.

It is to be understood that the embodiments described herein are merely illustrative of the arrangements according to the present invention. Various modifications may be made thereto by persons skilled in the art without departing from the spirit and scope of the invention.

What is claimed is:

1. An electromechanical resonator in the form of a single planar body comprising:
    an elongated torsionally vibratable member;
    a flexurally vibratable resonating element coupled along its nodal axis to said member;
    electromechanical transducer means attached to at least one side of said element for exciting mechanical vibrations in the resonator; and
    means located at both ends of said member for attaching the resonator to a base, characterized in that the flexurally vibratable resonating element has a length, L, along a direction transverse to the torsionally vibratable member elongated direction, and a width, b, along said elongated direction such that the ratio L/b ranges between 3 and 4, thereby substantially eliminating unwanted flexural modes in the resonator.

2. An electromechanical resonator according to claim 1, wherein said L/b ratio is of the order of 3.8.

3. An electromechanical filter in the form of a single planar body comprising:
    an elongated torsionally vibratable central member;
    a plurality of flexurally vibratable resonators spaced along said central member at substantially equidistant positions at or about their respective nodal axes, each resonator extending transversely away from said central member in opposite directions in a single plane;

electromechanical input and output transducer means attached to the end resonators of said plurality of resonators for respectively exciting and detecting mechanical vibrations in the filter; and means located at both ends of said central member for attaching the filter to a base, characterized by each resonator of said plurality of resonators having a length along a direction transverse to the central member elongated direction, and a width along said central member elongated direction such that the length-over-width ratio of each resonator ranges between 3 and 4, thereby substantially eliminating unwanted flexural modes in the filter.

4. An electromechanical filter according to claim 3 wherein said ratio is of the order of 3.8.

5. An electromechanical filter according to claim 3 wherein said ratio is of the order of 3.3.

6. An electromechanical filter according to claim 3 wherein said plurality of resonators comprises a first group of resonators having a length-over-width ratio of the order of 3.8 and a second group of resonators having a length-over-width ratio of the order of 3.3.

7. An electromechanical filter according to claim 3 wherein said central member comprises a plurality of coupling bars of substantially equal lengths positioned between said plurality of resonators.

8. An electromechanical filter in the form of a single planar body comprising:

an elongated torsionally vibratable member;

a flexurally vibratable resonating element coupled along its nodal axis to said member;

electromechanical input and output transducer means attached to said element for respectively exciting and detecting mechanical vibrations in the filter; and means located at both ends of said member for attaching the filter to a base, characterized in that the flexurally vibratable resonating element has a length, L, along a direction transverse to the torsionally vibratable member elongated direction, and a width, b, along said elongated direction such that the ratio L/b ranges between 3 and 4, thereby substantially eliminating unwanted flexural modes in the filter.

* * * * *